(12) United States Patent
Abe

(10) Patent No.: US 11,319,643 B2
(45) Date of Patent: May 3, 2022

(54) METHOD FOR PULLING UP SILICON MONOCRYSTAL

(71) Applicant: SUMCO CORPORATION, Tokyo (JP)

(72) Inventor: Takahiro Abe, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 30 days.

(21) Appl. No.: 16/605,636

(22) PCT Filed: Feb. 15, 2018

(86) PCT No.: PCT/JP2018/005150
§ 371 (c)(1),
(2) Date: Oct. 16, 2019

(87) PCT Pub. No.: WO2018/198488
PCT Pub. Date: Nov. 1, 2018

(65) Prior Publication Data
US 2020/0071846 A1  Mar. 5, 2020

(30) Foreign Application Priority Data

Apr. 27, 2017  (JP) .............................. JP2017-088218

(51) Int. Cl.
*C30B 15/10* (2006.01)
*C30B 29/06* (2006.01)

(52) U.S. Cl.
CPC .............. *C30B 15/10* (2013.01); *C30B 29/06* (2013.01)

(58) Field of Classification Search
CPC .......... C30B 15/00; C30B 15/02; C30B 15/10
See application file for complete search history.

(56) References Cited

U.S. PATENT DOCUMENTS

| 6,165,425 A | 12/2000 | Lange et al. |
| 8,420,192 B2 | 4/2013 | Yamagata et al. |

(Continued)

FOREIGN PATENT DOCUMENTS

| CN | 1096506 C | 12/2002 |
| CN | 102909163 A | 2/2013 |

(Continued)

OTHER PUBLICATIONS

Office Action for JP App. No. 2017-088218 dated Jun. 2, 2020 (w/ translation).

(Continued)

*Primary Examiner* — Robert M Kunemund
(74) *Attorney, Agent, or Firm* — Greenblum & Bernstein, P.L.C.

(57) ABSTRACT

Provided is a method for pulling up and growing, by the Czochralski method, a silicon monocrystal from a melt obtained by fusing a silicon raw material for crystals within a quartz crucible. When the inner wall of the quartz crucible is made of a synthetic quartz layer, a gel-like liquid including a devitrification accelerator, a thickening agent, and a solvent is applied to the bottom surface of the quartz crucible inner wall or to both the bottom surface and the lateral surface thereof prior to filling the silicon raw material for crystals into the quartz crucible, whereas when the inner wall of the quartz crucible is made of a natural quartz layer, the gel-like liquid is applied to both the bottom surface and the lateral surface of the inner wall of the quartz crucible prior to filling the silicon raw material for crystals into the quartz crucible.

6 Claims, 2 Drawing Sheets

(56) References Cited

U.S. PATENT DOCUMENTS

| | | | |
|---|---|---|---|
| 11,162,186 B2 | 11/2021 | Kishi et al. | |
| 2003/0094131 A1 | 5/2003 | Tsujimoto et al. | |
| 2007/0151504 A1* | 7/2007 | Hansen | C03C 17/004 |
| | | | 117/13 |
| 2008/0092804 A1* | 4/2008 | Hansen | C30B 35/002 |
| | | | 117/206 |
| 2013/0247818 A1 | 9/2013 | Wang et al. | |
| 2014/0150714 A1* | 6/2014 | Horioka | C03C 17/3417 |
| | | | 117/208 |
| 2015/0040820 A1* | 2/2015 | Kato | C30B 15/22 |
| | | | 117/30 |

FOREIGN PATENT DOCUMENTS

| | | |
|---|---|---|
| CN | 103154330 A | 6/2013 |
| DE | 11 2017 004 764 T5 | 6/2019 |
| JP | H08-2932 | 1/1996 |
| JP | 11-21196 A | 1/1999 |
| JP | 3046545 B2 | 5/2000 |
| JP | 2001-510434 A | 7/2001 |
| JP | 2002-029890 A | 1/2002 |
| JP | 2003-160393 A | 6/2003 |
| JP | 2003-192391 A | 7/2003 |
| JP | 2005-306708 A | 11/2005 |
| JP | 2007-001793 A | 1/2007 |
| JP | 2007-277026 A | 10/2007 |
| JP | 2013-095652 A | 5/2013 |
| JP | 2020-200236 A | 12/2020 |
| KR | 10-2012-0022885 | 3/2012 |
| WO | 2018/055974 | 3/2018 |

OTHER PUBLICATIONS

International Search Report issued in International Patent Application No. PCT/JP2018/005150, dated May 22, 2018.

International Preluninaiy Report on Patentability for International Patent Application No. PCT/JP2018/005150, dated Oct. 29, 2019.

Written Opinion of the International Searching Authority for International Patent Application No. PCT/JP2018/005150, dated May 22, 2018.

Office Action for CN App. No. 201880027700.6, dated Jan. 5, 2021 (w/ translation).

Decision of Refusal (Office Action) for Taiwanese Application No. 107106794, dated Nov. 9, 2018; and English-language translation thereof.

Decision of Refusal (Office Action) for Taiwanese Application No. 107106794, dated Sep. 23, 2019; and English-language translation thereof.

Office Action for KR App. No. 10-2019-7028456, dated Nov. 16, 2020 (w/ translation).

Office Action for DE App. No. 11 2018 002 215.3, dated Feb. 21, 2022 (w/ translation).

* cited by examiner

METHOD FOR PULLING UP SILICON MONOCRYSTAL

TECHNICAL FIELD

The present invention relates to a method for pulling up silicon monocrystal using the Czochralski method. More specifically, it relates to a method for pulling up silicon monocrystal capable of preventing deterioration of crystal quality due to occurrence of dislocation during crystal growth and improving yield and productivity even if it is a pulling up operation of the monocrystal over a long period of time, by devitrifying (crystallizing) the inner wall surface of the quartz crucible safely, efficiently and uniformly during pulling up the silicon monocrystal. This international application claims priority based on Japanese Patent Application No. 088218 (Japanese Patent Application No. 2017-088218) filed on Apr. 27, 2017, and the entire contents of Japanese Patent Application No. 2017-088218 is incorporated into this international application.

BACKGROUND ART

There are various methods for producing a silicon monocrystal used for a semiconductor substrate, and among them, a rotational pulling method called Czochralski method (CZ method) is widely adopted.

FIG. 1 is a schematic view schematically showing an example of a general silicon monocrystal pulling apparatus 10 used when pulling up a silicon monocrystal by the Czochralski method. The appearance of the pulling apparatus 10 is constituted by a chamber 11, and a crucible 12 is disposed at the center thereof. The crucible 12 has a double-layered structure, and is constituted by an inner-layer holding vessel (hereinafter simply referred to as "quartz crucible") 12a made of quartz and having a bottomed cylindrical shape, and an outer-layer holding vessel (hereinafter simply referred to as "graphite crucible") 12b made of graphite and similarly having a bottomed cylindrical shape, which is adapted to hold the outside of the quartz crucible 12a.

The crucible 12 is fixed to the upper end of a support shaft 13 which can rotate and move up and down. A resistance heating type heater 14 is disposed substantially concentrically on the outside of the crucible 12, and by melting a silicon raw material for crystallization of a predetermined weight introduced into the crucible 12 under heating, a melt 16 is filled in the crucible 12.

On the central axis of the crucible 12 to be filled with the melt 16, a pulling shaft (or a wire, hereinafter both are combined and referred to as "pulling shaft") 17 which rotates at a predetermined speed in the opposite direction or the same direction on the same axis as that of a support shaft 13 is disposed, and at the lower end of the pulling shaft 17, a seed crystal 18 is retained.

In order to pull up a silicon monocrystal using such a pulling apparatus, first, a silicon raw material for crystal is put into the quartz crucible 12a, and then, by melting the silicon raw material for crystal under heating with the above-mentioned heater 14 in an inert gas atmosphere under reduced pressure, the melt 16 is filled in the quartz crucible 12a. Then, the seed crystal 18 held at the lower end of the pulling shaft 17 is immersed in the surface of the melt 16, and gradually pulling the pulling shaft 17 upward while rotating the crucible 12 and the pulling shaft 17, a silicon monocrystal 19 can be grown on the lower end surface of the seed crystal 18.

As described above, in pulling up a silicon monocrystal by the CZ method, the melt in which the silicon raw material for crystal is melted is held by the quartz crucible of the double-structure crucible. When the quartz crucible holds the silicon melt, the surface of the crucible is exposed to a high temperature of 1,500° C. or higher, and the time usually takes several ten hours whereas it may vary depending on the conditions such as the filling amount of the raw material silicon, the crystal growth rate and the like.

Further, recently, in order to improve productivity, a recharge pull-up method (RCCZ method) for producing a plurality of silicon monocrystals from the same crucible has been developed (for example, see Non-Patent Document 1). In such a recharge pull-up method, the time of the quartz crucible exposed to the silicon melt reaches several hundred hours in some cases.

In general, during the inner wall surface of the quartz crucible in contact with the silicon melt in a high temperature state, brown cristobalite called brownish ring is generated, and this gradually grows. When this cristobalite is peeled off from the surface of the inner wall in the process of pulling up the silicon monocrystal, it inhibits crystal growth and causes occurrence of dislocation of the silicon monocrystal. In order to prevent such crystallization of the inner surface of the crucible (formation of cristobalite) and occurrence of dislocation associated with its peeling, various measures have been conventionally studied.

For example, in Patent Document 1 and Patent Document 2, there are described that a crystallization accelerator is applied or distributed on an inner wall of a quartz crucible and the entire inner surface is crystallized, and the quartz crucible described in Patent Document 2 is characterized in that the devitrification accelerator is distributed on the inner surface or outer surface of the quartz crucible side wall.

Further, in Patent Document 3 and Patent Document 4, there are disclosed a method in which calcium monoxide, barium monoxide or barium carbonate is directly contained in a melt as a devitrification accelerator.

Also, in Patent Document 5, there is disclosed a method in which a mixture containing a metal salt of magnesium and the like and a partial hydrolyzate of an alkoxysilane oligomer (silica sol liquid) is subjected to coating onto a crucible surface, and this is baked at a predetermined temperature to form a transparent coating layer containing a crystallization accelerator derived from the above-mentioned metal salt. Further, in Patent Document 6, there is disclosed a method in which a devitrification accelerator is contained in an inner layer of a quartz crucible wall. Moreover, in Patent Document 7, there is disclosed a method in which barium carbonate is used as a devitrification accelerator, an inner wall surface of a quartz crucible is charged, and barium carbonate is uniformly attached to the surface thereof.

PRIOR ART DOCUMENTS

Non-Patent Document

Non-Patent Document 1: written by Fumio Shimura, "Semiconductor Silicon Crystal Engineering" pp. 72-73, September 1993, Maruzen

Patent Documents

Patent Document 1: JP Hei.08-2932A (claims 1 to 3, paragraph [0014], paragraph [0015])
Patent Document 2: JP Patent No. 3,046,545 (claims 1 to 5, paragraph [0029], paragraph [0030], paragraph [0037])

Patent Document 3: JP Hei.11-21196A (claim 1, paragraph [0007], paragraph [0008])
Patent Document 4: JP 2007-277026A (claim 1, paragraph [0015], paragraph [0016])
Patent Document 5: JP 2003-192391A (claims 1 to 6, paragraph [0003], paragraph [0004])
Patent Document 6: JP 2005-306708A (claims 1 to 5, paragraph [0015])
Patent Document 7: JP 2007-001793A (claim 1, paragraph [0009] to paragraph [0011])

SUMMARY OF THE INVENTION

Problems to be Solved by the Invention

However, in the method disclosed in the above-mentioned Patent Document 1, there is a problem in the point of investment for equipment since a device, etc., for rotating the crucible during heat treatment or coating is required. Also, in the method disclosed in the above-mentioned Patent Document 2, a salt soluble in water or an alcohol, in particular, barium hydroxide is recommended as a devitrification accelerator, but in the case of a barium compound, there are problems that those soluble in water or an alcohol have high toxicity and handling thereof is difficult. In addition, as a method of applying a material soluble in water or an alcohol, in Patent Document 2 or the like, a spray coating method or a drop coating method is mentioned, but in the spray coating method, it is necessary to carry out while heating the crucible to 200 to 300° C., and in the drop coating method, it is necessary to coat while rotating the crucible so that investment for equipment is required. On the other hand, with regard to those insoluble in liquid such as barium carbonate, calcium carbonate and the like, uniform application is difficult by the method and conditions disclosed in Patent Document 2 and the like. In addition, the method of Patent Document 2 is characterized in that the devitrification accelerator is distributed on the side surface of the inner wall and outer wall of the quartz crucible, but in order to prevent occurrence of dislocation of the silicon monocrystal, it is important to forma suitable crystallization layer onto the bottom surface of the quartz crucible inner wall, and in particular, the importance is further increased in the recharge pull-up method in which a plurality of silicon monocrystals are pulled up from the same crucible.

Further, in the case of the method in which the devitrification accelerator is directly contained in the melt as in the methods disclosed in the above-mentioned Patent Documents 3 and 4, the amount of use must be increased compared to the method of coating on the crucible, so that there is concern about the influence on the crystal quality of the silicon monocrystal to be pulled up.

Moreover, in the means to contain the devitrification accelerator inside the crucible wall as in the methods disclosed in the above-mentioned Patent Documents 5 and 6, it is difficult to uniformly devitrify the inner wall surface, and conversely, the yield of the silicon monocrystal may deteriorate in some cases.

Further, according to the method of the above-mentioned Patent Document 7, although coating is easy as in the above-mentioned Patent Document 2, it is not necessary to apply in the state of highly toxic barium hydroxide, and stable coating can be carried out in the state of barium carbonate which is insoluble and difficult in uniform coating, so that it is very excellent in terms of safety and the like. On the other hand, in order to pull up the silicon monocrystal having a diameter of 300 mm, which has become mainstream in recent years, a large-sized quartz crucible having a diameter of more than 800 mm is required, and to charge such large-sized crucible, a large-sized facility is needed and a cost is enormous.

An object of the present invention is to provide a method for pulling up silicon monocrystal capable of preventing deterioration of crystal quality due to occurrence of dislocation during crystal growth, and improving yield and productivity, even in a pulling up operation of a silicon monocrystal for a long period of time by safely and efficiently, and yet uniformly denitrifying (crystallization) the inner wall surface of the quartz crucible to pull up the silicon monocrystal.

Means to Solve the Problems

As a result of intensive researches conducted by the present inventor, it was found that when a material in which barium carbonate fine powder is mixed with water and made to be a paste state is applied to an inner wall surface of a quartz crucible and dried, it can be used without peeling off from the inner wall surface by ordinary work. However, in order to make a powdery material into a paste form with water alone, the amount of powder becomes very large, and in this state, there is a problem that devitrification becomes strong and peeling occurs. On the other hand, even if it is simply mixed with a large amount of water, the barium carbonate fine powder precipitates, and even if it is applied immediately after stirring on the inner wall surface of the quartz crucible, there is a problem that wettability of the inner wall surface is low so that water is repelled on the inner wall surface, and coating unevenness occurs. If coating unevenness occurs, unevenness also occurs in devitrification, and the durability of the quartz crucible cannot be sufficiently improved. Thus, it can be found that by mixing barium carbonate fine powder with a gel-like liquid, it can be uniformly applied at any concentration without precipitation and without being repelled by the inner wall surface of the quartz crucible, whereby he reached the present invention.

According to a first aspect of the present invention, in a method for pulling up and growing, by the Czochralski method, a silicon monocrystal from a melt obtained by fusing a silicon raw material for crystals within a quartz crucible, in the case where an inner wall of the quartz crucible is made of a synthetic quartz layer, a gel-like liquid comprising a devitrification accelerator, a thickening agent and a solvent is applied to a bottom surface of the quartz crucible inner wall or to both the bottom surface and a lateral surface thereof prior to filling the silicon raw material for crystals into the quartz crucible, in the case where the inner wall of the quartz crucible is made of a natural quartz layer, the gel-like liquid is applied to both the bottom surface of the inner wall and the lateral surface of the inner wall of the quartz crucible prior to filling the silicon raw material for crystals into the quartz crucible.

A second aspect of the present invention is the invention based on the first aspect, characterized in that the devitrification accelerator comprises an alkaline earth metal or a compound containing an alkaline earth metal.

A third aspect of the present invention is the invention based on the second aspect, characterized in that the alkaline earth metal is magnesium, calcium, strontium or barium.

A fourth aspect of the present invention is the invention based on the second aspect, characterized in that the compound containing an alkaline earth metal is barium carbonate.

A fifth aspect of the present invention is the invention based on any of the first to fourth aspects, characterized in that a viscosity of the gel-like liquid is 10 to 500 mPa·s.

A sixth aspect of the present invention is the invention based on any of the first to fourth aspects, characterized in that a highly volatile solvent having a boiling point of less than 90° C. at normal pressure is contained as a solvent for the gel-like liquid.

A seventh aspect of the present invention is the invention based on any of the second to fourth aspects, characterized in that in the case where the inner wall of the quartz crucible is made of a synthetic quartz layer, the gel-like liquid is applied at a coating amount such that an amount of the alkaline earth metal or the compound containing the alkaline earth metal attached thereto is $1.0 \times 10^{13}$ to $1.0 \times 10^{16}$ atoms/cm$^2$ per 1 cm$^2$ of the inner wall, and in the case where the inner wall of the quartz crucible is made of a natural quartz layer, the gel-like liquid is applied at a coating amount such that an amount of the alkaline earth metal or the compound containing the alkaline earth metal attached thereto is $1.0 \times 10^{15}$ to $1.0 \times 10^{18}$ atoms/cm$^2$ per 1 cm$^2$ of the inner wall.

An eighth aspect of the present invention is the invention based on any of the first to seventh aspects, characterized in that a plurality of silicon monocrystals are pulled up using the same quartz crucible.

A ninth aspect of the present invention is the invention based on any of the first to eighth aspects, characterized in that the gel-like liquid is applied with a brush made of chemical fiber or scraper at room temperature, or the gel-like liquid is applied by spraying at room temperature.

Effects of the Invention

In the method for pulling up silicon monocrystal according to the first aspect of the present invention, in a method for pulling up and growing, by the Czochralski method, a silicon monocrystal from a melt obtained by fusing a silicon raw material for crystals within a quartz crucible, in the case where an inner wall of the quartz crucible is made of a synthetic quartz layer, a gel-like liquid comprising a devitrification accelerator, a thickening agent, and a solvent is applied to the bottom surface of the quartz crucible inner wall or to both the bottom surface and the lateral surface thereof prior to filling the silicon raw material for crystals into the quartz crucible, and in the case where an inner wall of the quartz crucible is made of a natural quartz layer, the gel-like liquid is applied to both the bottom surface and the lateral surface of the inner wall of the quartz crucible prior to filling the silicon raw material for crystals into the quartz crucible. Thus, in the pulling method of the present invention, the devitrification accelerator is mixed with a viscous material or the like to be applied as a gel-like liquid to which a coating property or the like is imparted. According to this procedure, even with respect to the devitrification accelerator which has conventionally been difficult to apply uniformly, it can be stably applied without the need for a large-sized facility, etc., and the inner wall surface of the quartz crucible can be simply and easily devitrified (crystallized) without unevenness. Therefore, surface state of the quartz crucible inner wall during pulling up the silicon monocrystal can be stabilized safely and at a low cost. In addition, even in the pulling operation of a monocrystal for a long time, it is possible to prevent occurrence of dislocation during crystal growth and deterioration of the crystal quality due to the dislocation, and the yield and productivity can be greatly improved.

In the method for pulling up silicon monocrystal according to the second aspect of the present invention, the above-mentioned devitrification accelerator comprises an alkaline earth metal or a compound containing an alkaline earth metal, so that the crystal quality can be made better as compared with the case where other than these, for example, a devitrification accelerator comprising an alkali metal or the like is used.

In the method for pulling up silicon monocrystal according to the third aspect of the present invention, since the above-mentioned alkaline earth metal is magnesium, calcium, strontium or barium, the effect of reducing metal contamination can be more enhanced as compared with the case of using an alkali metal or the like.

In the method for pulling up silicon monocrystal according to the fourth aspect of the present invention, the above-mentioned compound containing an alkaline earth metal is barium carbonate, and therefore, safety can be more heightened as compared with the case where other than these, for example, barium hydroxide or the like is used.

In the method for pulling up silicon monocrystal according to the fifth aspect of the present invention, since the viscosity of the gel-like liquid is 10 to 500 mPa·s, the problems that the gel-like liquid is repelled on the surface of the crucible surface during application, and coating unevenness occurs due to high viscosity are suppressed.

In the method for pulling up silicon monocrystal according to the sixth aspect of the present invention, a highly volatile solvent having a boiling point of less than 90° C. at normal pressure is contained as a solvent for the gel-like liquid. Since the solvent is highly volatile, the gel-like liquid is naturally dried in a short time, and it is not necessary to perform long-time natural drying or heat drying. As a result, the time from application to filling can be shortened, and a dryer is not required, whereby the production efficiency can be further improved and the production cost can be suppressed.

In the method for pulling up silicon monocrystal according to the seventh aspect of the present invention, in the case where an inner wall of the quartz crucible is made of a synthetic quartz layer, the gel-like liquid is applied at a coating amount such that an amount of the alkaline earth metal or the compound containing the alkaline earth metal attached thereto is $1.0 \times 10^{13}$ to $1.0 \times 10^{16}$ atoms/cm$^2$ per 1 cm$^2$ of the inner wall, and in the case where an inner wall of the quartz crucible is made of a natural quartz layer, the gel-like liquid is applied at a coating amount such that an amount of the alkaline earth metal or the compound containing the alkaline earth metal attached thereto is $1.0 \times 10^{15}$ to $1.0 \times 10^{18}$ atoms/cm$^2$ per 1 cm$^2$ of the inner wall. By applying with a predetermined application amount as described above, uniform devitrification with a suitable thickness can be easily obtained.

In the method for pulling up silicon monocrystal according to the eighth aspect of the present invention, since a plurality of silicon monocrystals are pulled up using the same quartz crucible, productivity of silicon monocrystals having high crystal quality can be greatly improved. In addition, since the number of quartz crucibles used can be reduced, the production cost can be reduced.

In the method for pulling up silicon monocrystal according to the ninth aspect of the present invention, the gel-like liquid is applied with a brush made of chemical fiber or scraper at room temperature, or the gel-like liquid is applied by spraying at room temperature. According to this procedure, there is no need to perform spraying and the like while heating or coating while rotating the crucible, and an inner wall of the quartz crucible can be devitrified more easily and at low cost. Therefore, there is no need to make investment of a special equipment, and the production cost can be reduced.

EMBODIMENTS TO CARRY OUT THE INVENTION

Figure 1:
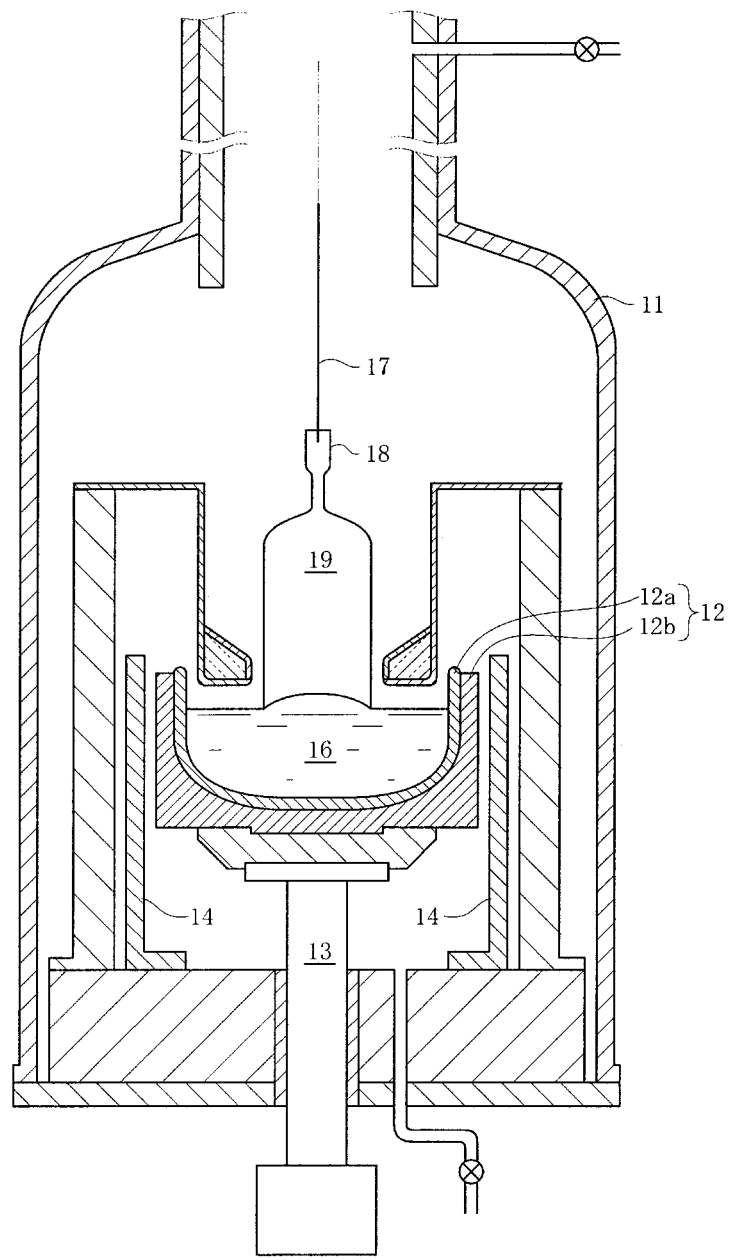
FIG. 1 is a schematic view of a general silicon monocrystal pulling apparatus.

Next, an embodiment to carry out the present invention will be described based on the drawings. The present invention relates to an improvement of a method for pulling up silicon monocrystal in which, for example, using a pulling apparatus 10 shown in FIG. 1, a silicon monocrystal 19 is pulled up and grown from a melt 16 which is a silicon raw material for crystal melted in a quartz crucible 12a by the Czochralski method. The characteristic constitution is that, in the case where an inner wall of the quartz crucible is made of a synthetic quartz layer, a gel-like liquid comprising a devitrification accelerator, a thickening agent, and a solvent is applied to the bottom surface of the quartz crucible inner wall or to both the bottom surface and the lateral surface thereof prior to filling the silicon raw material for crystals into the quartz crucible, and in the case where an inner wall of the quartz crucible is made of a natural quartz layer, the gel-like liquid is applied to both the bottom surface of the inner wall and the lateral surface of the inner wall of the quartz crucible prior to filling the silicon raw material for crystals into the quartz crucible. That is, this method does not simply dissolve the devitrification accelerator in water or the like and apply it as in the prior art, but by applying in the form of a gel-like liquid, and is to apply the liquid by imparting physical properties suitable for the surface state of the quartz crucible to the devitrification accelerator in the viewpoint of coating properties and the like. Therefore, the effect of the properties of the devitrification accelerator itself is small, and even when an insoluble compound and the like is used, uniform application can be performed without causing problems such as coating unevenness and the like, so that durability of the quartz crucible can be improved by suppressing devitrification unevenness. Thus, it is not necessary to dare to use in the state of a compound having solubility in consideration of coating properties etc., and even when a devitrification accelerator which is insoluble and difficult to apply is used, a large scale equipment is not necessary. In addition, in the present specification, gel-like means the state which has a viscosity of at least 10 mPa·s or more higher than the viscosity of water. When the liquid containing a devitrification accelerator, a thickening agent and a solvent is not in the form of gel, that is, when the viscosity is less than 10 mPa·s, even when the thickening agent is contained, the viscosity is insufficient so that the liquid containing the devitrification accelerator, the thickening agent and the solvent is repelled on the inner wall surface of the quartz crucible having low wettability, whereby a uniform coating layer cannot be formed, resulting in devitrification unevenness.

The devitrification accelerator contained in the gel-like liquid preferably comprises an alkaline earth metal or a compound containing the alkaline earth metal (hereinafter also referred to as the alkaline earth metal and the like). The above-mentioned alkaline earth metal may be mentioned magnesium, calcium, strontium, barium and the like. Also, the compound containing the alkaline earth metal may be mentioned a carbonic acid salt of the above-mentioned alkaline earth metal and the like. Specifically, barium carbonate, calcium carbonate and the like may be mentioned. Among them, in the method of the present invention, in particular, barium carbonate, which is difficult to carry out stable coating and requires a large amount of equipment and the like in the conventional method, can be suitably used. Since barium carbonate is in the form of powder, it is preferable also from the viewpoint of easy handling, little solubility in water and the like.

The gel-like liquid is prepared by mixing the thickening agent, the solvent and the like in addition to the devitrification accelerator, and the viscosity is preferably adjusted to a range of 500 mPa·s or less. If the viscosity of the gel-like liquid exceeds 500 mPa·s, the gel-like liquid may become too hard, and there is a fear of difficulty in forming a uniform coating layer. Among these, it is particularly preferable to adjust the viscosity of the gel-like liquid to the range of 50 to 100 mPa·s.

The thickening agent used for preparation of the gel-like liquid is not particularly limited as long as it can impart a desired viscosity to the gel-like liquid and, for example, the thickening agent may be mentioned a carboxyvinyl polymer, a polyvinyl alcohol and the like. Among them, in order to minimize the influence on the quality of the silicon monocrystal even if it is dissolved in the melt of the silicon raw material for crystal, it is preferable to use an organic compound containing no elements other than carbon, oxygen and hydrogen or small contents thereof. Further, those which can impart an appropriate viscosity with a relatively small amount are preferable. For these reasons, as the thickening agent, a carboxyvinyl polymer or a polyvinyl alcohol is particularly preferable.

Moreover, the solvent to be used for preparing the gel-like liquid may be mentioned water, an alcohol and the like. Among these, ethanol which is a highly volatile solvent having a boiling point at normal pressure of 65 to 85° C., and the like, is particularly preferable. If these highly volatile solvents are used as the solvent, after applying the gel-like liquid to the inner wall surface of the quartz crucible by the method described later, it can be naturally dried in a short time, and immediately transferred to the next step. In the present specification, the short time refers to a time of about 1 to 2 minutes.

To prepare a gel-like liquid, a thickening agent is firstly added to a solvent to dissolve therein to prepare a gel having a desired viscosity, and then a devitrification accelerator is added and mixed. Incidentally, as described later, the addition ratio of the devitrification accelerator to the gel is very small, and the viscosity of the gel-like liquid immediately after preparation (within 24 hours after preparation) is substantially the same viscosity of the gel before adding the devitrification accelerator. Therefore, in the present specification, the viscosity of the gel-like liquid is simulated by the viscosity of the gel. That is, the viscosity of the gel is preferably adjusted in the range of 10 to 500 mPa·s which is substantially the same as the viscosity of the gel-like liquid after preparation, and the mixing ratio of the thickening agent and the solvent is preferably so adjusted to be in the range that the viscosity of the gel to be prepared is in the above range. The specific mixing ratio of the thickening agent and the solvent depends on the viscosity of the gel to be targeted, or the kinds of the thickening agent and the solvent to be used and the like, and preferably in the range of 1:1,000 to 1:10 in the mass ratio (the thickening agent:the solvent).

The method of adding the devitrification accelerator to the above-mentioned prepared gel and mixing them is not particularly limited, and after adding the devitrification accelerator to the above-mentioned prepared gel, it is sufficiently mixed and dispersed therein using a stirring rod, a magnet stirrer and the like. At this time, the amount of the devitrification accelerator is preferably a ratio of 0.01 to 5% by mass based on 100% by mass of the gel-like liquid after preparation. If the ratio of the devitrification accelerator occupied in the gel-like liquid after preparation is less than the lower limit value, the amount of the alkaline earth metal adhered to the inner wall surface of the quartz crucible becomes too small so that sufficient devitrification cannot be obtained, and problems may occur during pulling up the monocrystal. On the other hand, if it exceeds the upper limit value, the amount of the alkaline earth metal adhered to the inner wall surface of the quartz crucible becomes too much so that devitrification may occur excessively, and peeling may occur from the wall surface of the crucible. Also, when a powder state material is used as the devitrification accelerator, it is preferable to use a material having an average particle diameter of 1 μm or less. If the average particle diameter of the powder added as a devitrification accelerator is too large, it cannot be uniformly applied and coating unevenness and the like may be caused in some cases.

The above-mentioned prepared gel-like liquid is applied to a bottom surface of an inner wall of the quartz crucible (inner surface of the crucible for containing the silicon raw material for crystal and the melt thereof) or to both the bottom surface and a lateral surface thereof prior to filling the silicon raw material for crystals into the quartz crucible. Incidentally, when a curved surface for binding the lateral surface and the bottom surface is provided, the portion of the curved surface shall be included in the bottom surface. The gel-like liquid may be applied to the outer wall (outer surface) in conjunction with the application to the inner wall. By the uniform devitrification of the inner wall bottom portion, the effect of suppressing occurrence of dislocation during crystal growth can be obtained, and by devitrification of the inner wall lateral surface, the effect of suppressing deformation of the quartz crucible can be obtained. Thus, by applying to both the bottom surface and the lateral surface of the inner wall, the effect of suppressing occurrence of dislocation can be obtained, and durability can be imparted to the quartz crucible. However, since the synthetic quartz is less likely to peel off the devitrified portion compared to natural quartz, durability is improved even when it is applied only to the bottom portion having a long contact time with the melt. For this reason, when the inner wall of the quartz crucible is a synthetic quartz layer, it can employ not only the method of applying to both the above-mentioned bottom surface and the lateral surface, but also the method of applying only to the bottom surface of the inner wall of the quartz crucible. In addition, the gel-like liquid may be applied to the entire bottom surface of the quartz crucible inner wall, and/or to the entire surface of the lateral surface, and from the aspect of manufacturing cost and contamination of impurities into the monocrystal and the like, it may apply to a region of a part of the bottom surface, and/or a part of the lateral surface. In this case, to the bottom surface, coating is carried out so that a ratio of the coating region of the bottom surface of the gel-like liquid occupied in the total area of the bottom surface as 100% becomes 60% or more. Also, to the lateral surface, it is desirable to apply to the region of the upper portion of the lateral surface. Incidentally, the upper portion of the lateral surface refers to the region from the portion to which the melt liquid surface contacts during pulling up to an upper end of a crucible. With regard to an application method of the gel-like liquid, it may be a conventional spray coating method, a drop coating method or the like. In order to reduce investment for equipment, a method of applying with a brush made of chemical fiber or a scraper, or a method of applying by spraying is desirable. Specifically, the gel-like liquid stored in a container is attached to a brush or a scraper at room temperature, or the gel-like liquid is atomized by spraying such as an atomizer, and application is carried out by applying this to the wall surface of the quartz crucible.

An amount of application of the gel-like liquid at this time is so prepared that an amount of the alkaline earth metal and the like attached per unit area of the inner wall of the quartz crucible is within the desired range. Specifically, in the case where the inner wall of the quartz crucible is made of a synthetic quartz layer, the gel-like liquid is preferably so applied with an application amount that the amount of the alkaline earth metal and the like attached per 1 $cm^2$ of the inner wall becomes $1.0 \times 10^{13}$ to $1.0 \times 10^{16}$ atoms/$cm^2$. If the gel-like liquid is applied with the application amount in which the amount of the alkaline earth metal and the like does not reach the lower limit value, there is a fear of not uniformly devitrified, and it is difficult to obtain sufficient durability. On the other hand, if it exceeds the upper limit value, devitrification tends to occur excessively, peeling is likely to occur from the wall surface of the crucible, and there is a fear of promoting occurrence of dislocation during crystal growth.

On the other hand, in the case where the inner wall of the quartz crucible is made of a natural quartz layer, the gel-like liquid is preferably so applied with an application amount that the amount of the alkaline earth metal and the like attached per 1 $cm^2$ of the inner wall becomes $1.0 \times 10^{15}$ to $1.0 \times 10^{18}$ atoms/$cm^2$. If the gel-like liquid is applied with the application amount in which the amount of the alkaline earth metal and the like does not reach the lower limit value, there is a fear of not uniformly devitrified, and it is difficult to obtain sufficient durability. On the other hand, if it exceeds the upper limit value, devitrification tends to occur excessively, peeling is likely to occur from the wall surface of the crucible, and there is a fear of promoting occurrence of dislocation during crystal growth. In this method, since the devitrification accelerator is applied to the inner wall surface of the quartz crucible in the form of a gel-like liquid mixed with other components such as a thickening agent and the like, adjustment of the concentration of the devitrification accelerator to be applied is easy, whereby the amount of the alkaline earth metal and the like attached to the inner wall can be easily adjusted. Incidentally, the reason why the above-mentioned problem is less likely to occur when the inner wall of the quartz crucible is a synthetic quartz layer even if the amount is relatively low is that the devitrification rate is faster than that of the natural quartz.

When a solvent having a boiling point of 90° C. or higher is used as a solvent for the gel-like liquid, it is desirable that after coating the gel-like liquid to the quartz crucible, it is dried under the condition of preferably exceeding 0 minute and 60 minutes or shorter. The reason why drying is carried out for 60 minutes or so is that time is required for drying when natural drying is carried out using a solvent having a high boiling point. Incidentally, as described above, when a solvent having a boiling point of less than 90° C. at normal pressure is used as a solvent, i.e., a highly volatile solvent is used, after natural drying is carried out for a short time, it can proceed to the next step immediately.

The process from filling the silicon raw material for crystal into the quartz crucible to pulling up the silicon monocrystal, after the gel-like liquid is applied to the quartz crucible and dried by heating or after it is applied and naturally dried, is not particularly limited and, for example, using the pulling apparatus 10 shown in FIG. 1, a plurality of silicon monocrystals 19 can be pulled up from the same crucible 12 according to the above-mentioned general pulling up conditions and procedure.

As described above, in the pulling method of the present invention, regardless of whether the devitrification accelerator exhibits solubility or is insoluble, it can be easily and uniformly applied to the quartz crucible. Then, in the pulling up procedure of the silicon monocrystal, or at the stage before pulling up after melting the silicon raw material for crystal, the inner wall surface of the quartz crucible can be efficiently and substantially uniformly devitrified. Therefore, the surface state of the quartz crucible inner wall during pulling up of the silicon monocrystal can be stabilized, peeling of the crystal pieces from the inner wall surface of the quartz crucible can be prevented, and occurrence of dislocation of the silicon monocrystal can be effectively suppressed. In addition, due to uniform and stable application of the devitrification accelerator, the inner wall of the quartz crucible is uniformly devitrified without unevenness, whereby durability of the quartz crucible can be improved, so that a plurality of silicon monocrystals can be pulled up using the same crucible.

EXAMPLE

Next, Examples of the present invention will be described in detail along with Comparative examples.

Example 1

Using the pulling apparatus 10 shown in FIG. 1, a silicon monocrystal was grown by the Czochralski method according to the following procedure. First, a carboxyvinyl polymer as a thickening agent is dissolved in water as a solvent to prepare a gel having a viscosity of 500 mPa·s. Here, barium carbonate fine powder was added at a ratio of 0.4% by mass as a devitrification accelerator, and sufficiently mixed with a stirring rod to prepare a gel-like liquid containing the devitrification accelerator. In Table 1, the viscosity of the prepared gel-like liquid is shown. Incidentally, the viscosity of the gel-like liquid shown in Table 1 is, as described above, a value simulated by the viscosity of the gel measured before adding the devitrification accelerator. Next, a quartz crucible 12a having an inner diameter of 600 mm and an inner wall formed of a natural quartz layer was prepared, and the above-mentioned prepared gel-like liquid was applied to the entire inner wall of the quartz crucible 12a (the entire surface of the bottom surface and the lateral surface) within two hours from the preparation with a predetermined application amount. Specifically, it was applied using a brush made of chemical fiber at room temperature. After applying the gel-like liquid, it was naturally dried in the air for 60 minutes. At this time, the amount of Ba element attached to the inner wall per 1 cm² by the application of the gel-like liquid was $8.5 \times 10^{16}$ atoms/cm² as calculated by the difference in application weight. Incidentally, the method by the difference in application weight refers to a method of calculating from the mass and the concentration of the used gel-like liquid. Then, 150 kg of the silicon raw material for crystal was filled in the above-mentioned quartz crucible 12a after application of the gel-like liquid, and this was melted to form a melt 16.

Then, using the above-mentioned pulling apparatus 10, a silicon monocrystal 19 with a diameter of 200 mm was pulled up from the melt in the quartz crucible 12a. Incidentally, in the pulling of the silicon monocrystal 19, three silicon monocrystals 19 were pulled up continuously from the same quartz crucible 12a. After pulling up the first silicon monocrystal 19, the pulled silicon monocrystal 19 was taken out from the pulling apparatus 10, then the silicon raw material for crystal of the same mass as this silicon monocrystal 19 was again introduced, and the second silicon monocrystal 19 was pulled up. Similarly, the third silicon monocrystal 19 was pulled up. Incidentally, the pulling up conditions (pulling speed, crucible rotating speed, and other conditions) were the same for all the three silicon monocrystals except that fine adjustment was carried out in accordance with change in the length of the straight body portion.

Example 2

A carboxyvinyl polymer as a thickening agent was dissolved in ethanol (a boiling point of 78° C. at a normal pressure of 1 atm) as a solvent to prepare a gel having a viscosity of 100 mPa·s. Here, barium carbonate fine powder was added at a ratio of 0.5% by mass as a devitrification accelerator, and sufficiently mixed with a magnetic stirrer to prepare a gel-like liquid containing the devitrification accelerator. Next, a quartz crucible 12a having an inner diameter of 800 mm and an inner wall formed of a natural quartz layer was prepared, and the above-mentioned prepared gel-like liquid was applied to the entire inner wall of the quartz crucible 12a within one hour from the preparation with a predetermined application amount. About the coating method and procedure, it was carried out by the method and procedure similar to Example 1. At this time, the amount of Ba element attached to the inner wall per 1 cm² by the application of the gel-like liquid was $9.2 \times 10^{15}$ atoms/cm² as calculated by the above-mentioned difference in application weight. Then, after applying a gel-like liquid, it was naturally dried for a short time. Subsequently, 300 kg of a silicon raw material for crystal was filled in the quartz crucible 12a after the gel-like liquid was naturally dried, and was melted to form a melt 16.

Then, a silicon monocrystal 19 with a diameter of 300 mm was pulled up from the melt in the quartz crucible 12a. Incidentally, in the pulling of the silicon monocrystal 19, three silicon monocrystals 19 were pulled continuously from the same quartz crucible 12a in the same manner as in Example 1. The pulling up conditions such as pulling speed, crucible rotating speed, and the like were the same for all the three silicon monocrystals except that fine adjustment was carried out in accordance with change in the length of the straight body portion.

Example 3

A polyvinyl alcohol as a thickening agent was dissolved in water as a solvent to prepare a gel having a viscosity of 30 mPa·s. Here, barium carbonate fine powder was added at a ratio of 0.04% by mass as a devitrification accelerator, and sufficiently mixed with a magnetic stirrer to prepare a gel-like liquid containing the devitrification accelerator. Next, a quartz crucible 12a having an inner diameter of 800 mm and an inner wall formed of a synthetic quartz layer was prepared, and the above-mentioned prepared gel-like liquid was applied to the entire inner wall of the quartz crucible 12a within 12 hours from the preparation with a predetermined application amount and naturally dried for 60 minutes. About the coating method and procedure, it was carried out by the method and procedure similar to Example 1. At this time, the amount of Ba element attached to the inner wall per 1 cm$^2$ by the application of the gel-like liquid was $7.8 \times 10^{14}$ atoms/cm$^2$ as calculated by the above-mentioned difference in application weight. Then, 300 kg of a silicon raw material for crystal was filled in the quartz crucible 12a after the gel-like liquid was naturally dried, and was melted to form a melt 16.

Then, a silicon monocrystal 19 with a diameter of 300 mm was pulled up from the melt in the quartz crucible 12a. Incidentally, in the pulling of the silicon monocrystal 19, three silicon monocrystals 19 were pulled continuously from the same quartz crucible 12a in the same manner as in Example 1. The pulling up conditions such as pulling speed, crucible rotating speed, and the like were the same as in Example 2 for all the three silicon monocrystals.

Example 4

A carboxyvinyl polymer as a thickening agent was dissolved in ethanol as a solvent to prepare a gel having a viscosity of 300 mPa·s. Here, calcium carbonate fine powder was added at a ratio of 0.3% by mass as a devitrification accelerator, and mixed to prepare a gel-like liquid containing the devitrification accelerator. Next, a quartz crucible 12a having an inner diameter of 800 mm and an inner wall formed of a synthetic quartz layer was prepared, and the above-mentioned prepared gel-like liquid was applied to the entire inner wall of the quartz crucible 12a within 8 hours from the preparation with a predetermined application amount. About the coating method and procedure, it was carried out by the method and procedure similar to Example 1. At this time, the amount of Ca element attached to the inner wall per 1 cm$^2$ by the application of the gel-like liquid was $2.5 \times 10^{15}$ atoms/cm$^2$ as calculated by the above-mentioned difference in application weight. Then, after applying a gel-like liquid, it was naturally dried for a short time. Subsequently, 300 kg of a silicon raw material for crystal was filled in the quartz crucible 12a after the gel-like liquid was naturally dried, and was melted to form a melt 16.

Then, a silicon monocrystal 19 with a diameter of 300 mm was pulled up from the melt in the quartz crucible 12a. Incidentally, in the pulling of the silicon monocrystal 19, three silicon monocrystals 19 were pulled continuously from the same quartz crucible 12a in the same manner as in Example 1. The pulling up conditions such as pulling speed, crucible rotating speed, and the like were the same as in Example 2 for all the three silicon monocrystals.

Comparative Example 1

In the same manner as in Example 1 except that a gel-like liquid containing a devitrification accelerator was not applied before filling 150 kg of the silicon raw material for crystal in the quartz crucible 12a, three silicon monocrystals 19 were pulled continuously from the same quartz crucible 12a in the same manner as in Example 1. The pulling up conditions such as pulling speed, crucible rotating speed, and the like were the same as in Example 1 for all the three silicon monocrystals.

Comparative Example 2

A carboxyvinyl polymer as a thickening agent was dissolved in ethanol as a solvent to prepare a gel having a viscosity of 100 mPa·s. Here, barium carbonate fine powder was added at a ratio of 0.5% by mass as a devitrification accelerator, and mixed to prepare a gel-like liquid containing the devitrification accelerator. Next, a quartz crucible 12a having an inner diameter of 800 mm and an inner wall formed of a natural quartz layer was prepared, and the above-mentioned prepared gel-like liquid was applied only to the lateral surface upper portion of the inner wall of the quartz crucible 12a within 5 hours from the preparation with a predetermined application amount. Incidentally, the upper portion refers to the area from the part where the melt liquid surface contacts during pulling up to the upper end of the crucible. About the coating method and procedure, it was carried out by the method and procedure similar to Example 1 except for the above. At this time, the amount of Ba element attached to the inner wall per 1 cm$^2$ by the application of the gel-like liquid was $9.2 \times 10^{15}$ atoms/cm$^2$ as calculated by the above-mentioned difference in application weight. Then, after applying a gel-like liquid, it was naturally dried for a short time. Subsequently, 300 kg of a silicon raw material for crystal was filled in the quartz crucible 12a after the gel-like liquid was naturally dried, and was melted to form a melt 16.

Then, a silicon monocrystal 19 with a diameter of 300 mm was pulled up from the melt in the quartz crucible 12a. Incidentally, in the pulling of the silicon monocrystal 19, three silicon monocrystals 19 were pulled continuously from the same quartz crucible 12a in the same manner as in Example 1. The pulling up conditions such as pulling speed, crucible rotating speed, and the like were the same as in Example 2 for all the three silicon monocrystals.

Example 5-1 to Example 5-5, Comparative Example 3-1, Comparative Example 3-2

A carboxyvinyl polymer as a thickening agent was dissolved in water (pure water) or ethanol as a solvent, and a liquid or a gel with a viscosity different in the range of 1 to 520 mPa·s was prepared for each Example or Comparative example. Here, barium carbonate fine powder was added at a ratio of 0.01% by mass as a devitrification accelerator, and mixed to prepare a gel-like liquid or a non-gel-like liquid containing the devitrification accelerator. Next, a quartz crucible 12a having an inner diameter of 450 mm and an inner wall formed of a natural quartz layer was prepared, and the above-mentioned prepared gel-like liquid or non-gel-like liquid was applied to a part of the inner wall of the quartz crucible 12a within 30 minutes from the preparation at room temperature using a brush made of chemical fiber with a predetermined application amount, then, in the air, it was naturally dried for 60 minutes in the case where the solvent was water, or naturally dried for a short time in the case where the solvent was ethanol. At this time, the amount of Ba element attached to the inner wall per 1 cm$^2$ by the application of the gel-like liquid or the non-gel-like liquid was $8.5 \times 10^{16}$ atoms/cm$^2$ as calculated by the above-mentioned difference in application weight. Then, the quartz crucible 12a after natural drying was subjected to heat treatment by maintaining for 10 hours under the conditions of a temperature of about 1200° C. and a pressure of 5 torr in a state without a melt.

Example 6-1 to Example 6-4, Comparative Example 4-1, 4-2

A carboxyvinyl polymer as a thickening agent was dissolved in ethanol (a boiling point of 78° C. at a normal pressure of 1 atm) to prepare a gel having a viscosity of 300 mPa·s. Here, barium carbonate fine powder was added at a ratio of 0.3% by mass as a devitrification accelerator, and sufficiently mixed with a magnetic stirrer to prepare a gel-like liquid containing the devitrification accelerator. Next, a quartz crucible 12a having an inner diameter of 600 mm and an inner wall formed of a synthetic quartz layer was prepared, and the above-mentioned prepared gel-like liquid was applied only to the bottom surface of the inner wall of the quartz crucible 12a within one hour from the preparation with a predetermined application amount. At that time, the ratio of the application area occupied in the total area of 100% of the bottom surface was changed for each Example within the range of 30 to 100% and applied. About the coating method and procedure, it was carried out by the method and procedure similar to Example 1. At this time, the amount of Ba element attached to the inner wall per 1 cm$^2$ by the application of the gel-like liquid was $2.5 \times 10^{15}$ atoms/cm$^2$ as calculated by the above-mentioned difference in application weight. Then, 150 kg of the silicon raw material for crystal was filled in the above-mentioned quartz crucible after applying the gel-like liquid, and was melted to form a melt 16.

Then, a silicon monocrystal 19 with a diameter of 200 mm was pulled up from the melt in the above-mentioned quartz crucible 12a. Incidentally, in the pulling of the silicon monocrystal 19, three silicon monocrystals 19 were pulled continuously from the same quartz crucible 12a in the same manner as in Example 1. The pulling up conditions such as pulling speed, crucible rotating speed, and the like were the same as in Example 2 for all the three silicon monocrystals.

Example 7-1 to Example 7-5

A carboxyvinyl polymer as a thickening agent was dissolved in ethanol as a solvent to prepare a gel having a viscosity of 100 mPa·s. Here, barium carbonate fine powder was added at a ratio of 0.01% by mass as a devitrification accelerator, and mixed to prepare a gel-like liquid containing the devitrification accelerator. Next, a quartz crucible 12a having an inner diameter of 450 mm and an inner wall formed of a synthetic quartz layer was prepared, and the above-mentioned prepared gel-like liquid was applied to a part of the inner wall of the quartz crucible 12a within 30 minutes from the preparation at room temperature using a brush made of chemical fiber by changing an application amount for each Example. At this time, each amount of Ba element attached to the inner wall per 1 cm$^2$ by the application of the gel-like liquid was $5.0 \times 10^{12}$ atoms/cm$^2$, $1.0 \times 10^{13}$ atoms/cm$^2$, $5.0 \times 10^{14}$ atoms/cm$^2$, $1.0 \times 10^{16}$ atoms/cm$^2$ and $5.0 \times 10^{16}$ atoms/cm$^2$, respectively, as calculated by the above-mentioned difference in application weight. Then, after natural drying for a short time, heat treatment was carried out by maintaining for 10 hours under the conditions of a temperature of about 1,200° C. and a pressure of 5 torr in a state without a melt.

Example 8-1 to Example 8-5

A carboxyvinyl polymer as a thickening agent was dissolved in ethanol as a solvent to prepare a gel having a viscosity of 100 mPa·s. Here, barium carbonate fine powder was added at a ratio of 0.03% by mass as a devitrification accelerator, and mixed to prepare a gel-like liquid containing the devitrification accelerator. Next, a quartz crucible 12a having an inner diameter of 450 mm and an inner wall formed of a natural quartz layer was prepared, and the above-mentioned prepared gel-like liquid was sprayed by mist spraying to a part of the inner wall of the quartz crucible 12a within 30 minutes from the preparation at room temperature by changing an application amount for each Example. At this time, each amount of Ba element attached to the inner wall per 1 cm$^2$ by the application of the gel-like liquid was $5.0 \times 10^{14}$ atoms/cm$^2$, $1.0 \times 10^{15}$ atoms/cm$^2$, $5.0 \times 10^{16}$ atoms/cm$^2$, $1.0 \times 10^{18}$ atoms/cm$^2$, $5.0 \times 10^{18}$ atoms/cm$^2$, respectively, as calculated by the above-mentioned difference in application weight. Then, after natural drying for a short time, heat treatment was carried out by maintaining for 10 hours under the conditions of a temperature of about 1,200° C. and a pressure of 5 torr in a state without a melt.

TABLE 1-1

|  | Devitrification accelerator | Coating form | Thickening agent | Solvent | Viscosity [mPa · s] |
| --- | --- | --- | --- | --- | --- |
| Example 1 | Barium carbonate | Gel-like | Carboxyvinyl polymer | Water | 500 |
| Example 2 | Barium carbonate | Gel-like | Carboxyvinyl polymer | Ethanol | 100 |
| Example 3 | Barium carbonate | Gel-like | Polyvinyl alcohol | Water | 30 |
| Example 4 | Calcium carbonate | Gel-like | Carboxyvinyl polymer | Ethanol | 300 |
| Comparative example 1 | — | — | — | — | — |
| Comparative example 2 | Barium carbonate | Gel-like | Carboxyvinyl polymer | Ethanol | 100 |
| Comparative example 3-1 | Barium carbonate | Non-gel-like | Carboxyvinyl polymer | Water | 1 |
| Comparative example 3-2 | Barium carbonate | Non-gel-like | Carboxyvinyl polymer | Ethanol | 5 |
| Example 5-1 | Barium carbonate | Gel-like | Carboxyvinyl polymer | Water | 10 |
| Example 5-2 | Barium carbonate | Gel-like | Carboxyvinyl polymer | Ethanol | 30 |
| Example 5-3 | Barium carbonate | Gel-like | Carboxyvinyl polymer | Water | 300 |
| Example 5-4 | Barium carbonate | Gel-like | Carboxyvinyl polymer | Ethanol | 500 |
| Example 5-5 | Barium carbonate | Gel-like | Carboxyvinyl polymer | Water | 520 |

TABLE 1-1-continued

|  | Devitrification accelerator | Coating form | Thickening agent | Solvent | Viscosity [mPa · s] |
|---|---|---|---|---|---|
| Comparative example 4-1 | Barium carbonate | Gel-like | Carboxyvinyl polymer | Ethanol | 300 |
| Comparative example 4-2 | Barium carbonate | Gel-like | Carboxyvinyl polymer | Ethanol | 300 |

TABLE 1-2

|  | Devitrification accelerator | Coating form | Thickening agent | Solvent | Viscosity [mPa · s] |
|---|---|---|---|---|---|
| Example 6-1 | Barium carbonate | Gel-like | Carboxyvinyl polymer | Ethanol | 300 |
| Example 6-2 | Barium carbonate | Gel-like | Carboxyvinyl polymer | Ethanol | 300 |
| Example 6-3 | Barium carbonate | Gel-like | Carboxyvinyl polymer | Ethanol | 300 |
| Example 6-4 | Barium carbonate | Gel-like | Carboxyvinyl polymer | Ethanol | 300 |
| Example 7-1 | Barium carbonate | Gel-like | Carboxyvinyl polymer | Ethanol | 100 |
| Example 7-2 | Barium carbonate | Gel-like | Carboxyvinyl polymer | Ethanol | 100 |
| Example 7-3 | Barium carbonate | Gel-like | Carboxyvinyl polymer | Ethanol | 100 |
| Example 7-4 | Barium carbonate | Gel-like | Carboxyvinyl polymer | Ethanol | 100 |
| Example 7-5 | Barium carbonate | Gel-like | Carboxyvinyl polymer | Ethanol | 100 |
| Example 8-1 | Barium carbonate | Gel-like | Carboxyvinyl polymer | Ethanol | 100 |
| Example 8-2 | Barium carbonate | Gel-like | Carboxyvinyl polymer | Ethanol | 100 |
| Example 8-3 | Barium carbonate | Gel-like | Carboxyvinyl polymer | Ethanol | 100 |
| Example 8-4 | Barium carbonate | Gel-like | Carboxyvinyl polymer | Ethanol | 100 |
| Example 8-5 | Barium carbonate | Gel-like | Carboxyvinyl polymer | Ethanol | 100 |

TABLE 1-3

|  | Crucible | | Application area | | Natural drying time |
|---|---|---|---|---|---|
|  | Material | Amount of alkaline earth metal element [atoms/cm$^2$] | Bottom surface | Lateral surface | |
| Example 1 | Natural quartz | $8.5 \times 10^{16}$ | 100% | 100% | 60 min |
| Example 2 | Natural quartz | $9.2 \times 10^{15}$ | 100% | 100% | Short time |
| Example 3 | Synthetic quartz | $7.8 \times 10^{14}$ | 100% | 100% | 60 min |
| Example 4 | Synthetic quartz | $2.5 \times 10^{15}$ | 100% | 100% | Short time |
| Comparative example 1 | Natural quartz | — | — | — | — |
| Comparative example 2 | Natural quartz | $9.2 \times 10^{15}$ | — | Only upper portion | Short time |
| Comparative example 3-1 | Natural quartz | $8.5 \times 10^{16}$ | A part | A part | 60 min |
| Comparative example 3-2 | Natural quartz | $8.5 \times 10^{16}$ | A part | A part | Short time |
| Example 5-1 | Natural quartz | $8.5 \times 10^{16}$ | A part | A part | 60 min |
| Example 5-2 | Natural quartz | $8.5 \times 10^{16}$ | A part | A part | Short time |
| Example 5-3 | Natural quartz | $8.5 \times 10^{16}$ | A part | A part | 60 min |
| Example 5-4 | Natural quartz | $8.5 \times 10^{16}$ | A part | A part | Short time |
| Example 5-5 | Natural quartz | $8.5 \times 10^{16}$ | A part | A part | 60 min |
| Comparative example 4-1 | Synthetic quartz | $2.5 \times 10^{15}$ | 30% | — | Short time |
| Comparative example 4-2 | Synthetic quartz | $2.5 \times 10^{15}$ | 50% | — | Short time |

TABLE 1-4

|  | Crucible | | Application area | | Natural drying time |
|---|---|---|---|---|---|
|  | Material | Amount of alkaline earth metal element [atoms/cm$^2$] | Bottom surface | Lateral surface | |
| Example 6-1 | Synthetic quartz | $2.5 \times 10^{15}$ | 60% | — | Short time |
| Example 6-2 | Synthetic quartz | $2.5 \times 10^{15}$ | 70% | — | Short time |
| Example 6-3 | Synthetic quartz | $2.5 \times 10^{15}$ | 80% | — | Short time |
| Example 6-4 | Synthetic quartz | $2.5 \times 10^{15}$ | 100% | — | Short time |
| Example 7-1 | Synthetic quartz | $5.0 \times 10^{12}$ | A part | A part | Short time |
| Example 7-2 | Synthetic quartz | $1.0 \times 10^{13}$ | A part | A part | Short time |
| Example 7-3 | Synthetic quartz | $5.0 \times 10^{14}$ | A part | A part | Short time |
| Example 7-4 | Synthetic quartz | $1.0 \times 10^{16}$ | A part | A part | Short time |
| Example 7-5 | Synthetic quartz | $5.0 \times 10^{16}$ | A part | A part | Short time |
| Example 8-1 | Natural quartz | $5.0 \times 10^{14}$ | A part | A part | Short time |
| Example 8-2 | Natural quartz | $1.0 \times 10^{15}$ | A part | A part | Short time |
| Example 8-3 | Natural quartz | $5.0 \times 10^{16}$ | A part | A part | Short time |
| Example 8-4 | Natural quartz | $1.0 \times 10^{18}$ | A part | A part | Short time |
| Example 8-5 | Natural quartz | $5.0 \times 10^{18}$ | A part | A part | Short time |

Comparative Test and Evaluation

Presence or absence of occurrence of dislocation and deformation of the quartz crucible in silicon monocrystals pulled up in Example 1 to Example 4, Comparative examples 1 and 2, Comparative examples 4-1 and 4-2 and Example 6-1 to Example 6-4 were evaluated. In addition, with respect to the quartz crucibles of Example 1 to Example 8-5 and Comparative example 2 to Comparative example 4-2, presence or absence of devitrification unevenness was evaluated. These results are shown in the following Table 2.

Figure 2:
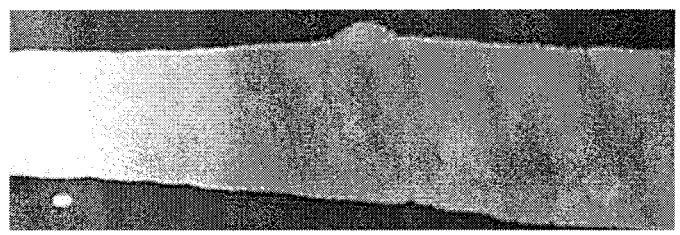
FIG. 2 is a photographic view of an inner wall surface of a quartz crucible free from uneven devitrification of Example 5-1 as observed visually.
Figure 3:
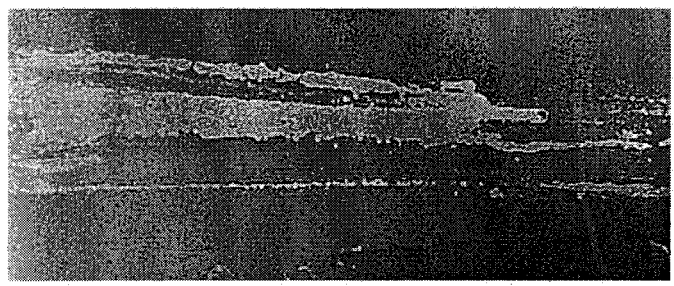
FIG. 3 is a photographic view of an inner wall surface of a quartz crucible with devitrification unevenness of Comparative Example 3-1 as observed visually.

Also, with respect to the evaluation of devitrification unevenness, the above-mentioned inner wall surface of the quartz crucible after the heat treatment was visually observed. A photograph of the inner wall surface of the quartz crucible after the heat treatment of Example 5-1 is shown in FIG. 2, and a photograph of the inner wall surface of the quartz crucible after the heat treatment of Comparative example 3-1 is shown in FIG. 3, respectively.

(i) Evaluation of occurrence of dislocation: Presence or absence of occurrence of dislocation in the pulled up silicon monocrystal was confirmed. The results were evaluated in four stages of A to D by the monocrystal ratio. In Table 2, "A" indicates that the ratio of the monocrystal weight (monocrystal ratio) occupied in the weight of the silicon raw material used is 80% or more, "B" indicates the case that the above-mentioned ratio is 70% or more to less than 80%, "C" indicates the case of 60% or more to less than 70%, and "D" indicates the case of less than 60%. Incidentally, the above-mentioned monocrystal ratio was evaluated by the value obtained by determining the monocrystal ratio from the total weight of the three silicon monocrystals pulled up and the total weight of the silicon raw materials used.

(ii) Presence or absence of deformation of quartz crucible: The quartz crucible used after pulling up a silicon monocrystal was cooled and taken out from the pulling apparatus, and the appearance was observed to confirm the presence or absence of deformation. The results were evaluated in three stages of A to C. In Table 2, "A" indicates the case where there was no deformation at all, "B" indicates the case where there was less than 10% deformation from before use, and "C" indicates the case where there was 10% or more deformation from before use.

(iii) Presence or absence of devitrification unevenness: Presence or absence of devitrification unevenness was confirmed by visually observing the inner wall with respect to the quartz crucible to which the gel-like or non-gel-like liquid was applied and subjected to heat treatment. Incidentally, in Example 1 to Example 4, Example 6-1 to Example 6-4, Example 7-1 to Example 7-5, Example 8-1 to Example 8-5, Comparative example 2 and Comparative example 4-1 and 4-2 in which pulling up of the silicon monocrystal was carried out, a quartz crucible to which the gel-like or non-gel-like liquid had been each coated with the same conditions as in each Example or Comparative example was separately prepared, and these were subjected to heat treatment with the same conditions as in Example 5-1 (under the conditions of a temperature of 1,200° C., a pressure of 5 torr for 10 hours) and the presence or absence of devitrification unevenness was confirmed by visually observing the inner wall. The results were evaluated in three stages of A to C. In Table 2, "A" indicates the case where the whole surface of the applied portion was uniformly devitrified, "B" indicates the case where 90% or more of the applied portion was devitrified, and "C" indicates the case where the devitrification of the applied portion was less than 90%.

TABLE 2

| | Evaluation of occurrence of dislocation by monocrystal ratio | Presence or absence of deformation and the like of crucible | Presence or absence of devitrification unevenness |
|---|---|---|---|
| Example 1 | A | A | A |
| Example 2 | A | A | A |
| Example 3 | B | A | A |
| Example 4 | A | A | A |
| Comparative Example 1 | D | C | — |
| Comparative Example 2 | D | B | A |
| Comparative Example 3-1 | — | — | C |
| Comparative Example 3-2 | — | — | B |
| Example 5-1 | — | — | A |
| Example 5-2 | — | — | A |
| Example 5-3 | — | — | A |
| Example 5-4 | — | — | A |
| Example 5-5 | — | — | B |
| Comparative Example 4-1 | D | C | A |
| Comparative Example 4-2 | C | C | B |
| Example 6-1 | A | B | A |
| Example 6-2 | B | B | B |
| Example 6-3 | B | A | A |
| Example 6-4 | B | A | A |
| Example 7-1 | — | — | B |
| Example 7-2 | — | — | A |
| Example 7-3 | — | — | A |
| Example 7-4 | — | — | A |
| Example 7-5 | — | — | A |
| Example 8-1 | — | — | B |
| Example 8-2 | — | — | A |
| Example 8-3 | — | — | A |
| Example 8-4 | — | — | A |
| Example 8-5 | — | — | A |

As can be clearly seen from Table 2, when Examples 1 to 4 and Comparative examples 1 and 2 are compared, in Comparative example 1 in which the treatment with the devitrification accelerator before filling the crystalline silicon raw material was not performed at all, occurrence of dislocation was observed in the third pull-up silicon monocrystal (Evaluation: D), and the monocrystal ratio was lowered overall. In addition, the straight body portion of the crucible also had a tendency of buckling deformation (Evaluation: C). Further, in Comparative example 2 in which the gel-like liquid was applied only to the upper portion of the quartz crucible inner wall, occurrence of dislocation was generated in the second half of pulling up the second silicon monocrystal (Evaluation: D), and the monocrystal ratio was lowered overall. This can be considered that this is mainly due to peeling of cristobalite from the portion to which the gel-like liquid was not applied. On the other hand, in Examples 1 to 4, all the three pulled up silicon monocrystals were almost dislocation-free over the entire area (Evaluation: A or B), and although the required time for pulling reached 200 hours with three monocrystals in total, no deformation of the crucible occurred (Evaluation: A), and further the entire surface of the applied portion was uniformly devitrified (Evaluation: A).

Moreover, when Example 5-1 to Example 5-5 are compared with Comparative example 3-1 and Comparative example 3-2, in Comparative example 3-1 in which a non-gel-like form with extremely low viscosity was applied, as in the photographic figure of FIG. 3, the devitrification accelerator could not be uniformly applied to the quartz crucible inner wall so that devitrification unevenness was confirmed (Evaluation: C). In addition, in Comparative example 3-2 where application was carried out in a non-gel-like state, whereas the viscosity thereof was higher than that of Comparative example 3-1, the devitrification accelerator could not be uniformly applied, and similar devitrification unevenness to that of Comparative example 3-1 was slightly confirmed (Evaluation B). In addition, in Example 5-5 in which the viscosity exceeds 500 mPa·s, the viscosity was high and the gel could not be uniformly applied so that devitrification unevenness was slightly confirmed (Evaluation B). On the other hand, in Example 5-1 to Example 5-4, as in the photographic figure of FIG. 2, no devitrification unevenness was observed (Evaluation A), and extremely good results could be obtained.

In addition, when Example 6-1 to Example 6-4 were compared with Comparative examples 4-1 and 4-2, in Comparative examples 4-1 and 4-2, in the case where the inner wall of the quartz crucible was made of a synthetic quartz layer, since the application ratio of the gel-like liquid with only the bottom surface was narrow as 30% or 50% based on the entire area of the bottom surface as 100%, so that the monocrystal ratio was low (Evaluation: C or D) and deformation of quartz crucible was present (Evaluation: C). In Comparative example 4-1, there was no devitrification unevenness (Evaluation: A), and in Comparative example 4-2, devitrification unevenness was slightly confirmed (Evaluation: B). On the other hand, in Example 6-1 to Example 6-4, in the case where the inner wall of the quartz crucible is made of a synthetic quartz layer, when the gel-like liquid was applied only to the bottom surface with a ratio of 60 to 100%, the monocrystal ratio was 70% or more (Evaluation: B or A) and deformation of the quartz crucible was slightly present or absolutely none (Evaluation: B or A), and 90% or more of the applied portion was devitrified or entire surface was uniformly devitrified (Evaluation: B or A). As a result, it was found that even with partial application, sufficient durability could be imparted and there was almost no occurrence of dislocation or devitrification unevenness.

In addition, in Example 7-1 to Example 7-5 in which the inner wall of the quartz crucible was formed of a synthetic quartz layer, when the application amount of the gel-like liquid was changed for each Example and an amount of Ba element attached to the inner wall per 1 cm$^2$, and in Example 7-1 in which the amount of Ba element was $5.0 \times 10^{12}$ atoms/cm$^2$, devitrification at the coated portion was 90% or more (Evaluation B). On the other hand, in Example 7-2 to Example 7-5, since the amounts of Ba element were $1.0 \times 10^{13}$ atoms/cm$^2$, $5.0 \times 10^{14}$ atoms/cm$^2$, $1.0 \times 10^{16}$ atoms/cm$^2$ and $5.0 \times 10^{16}$ atoms/cm$^2$, the entire surface of the applied portion was all uniformly devitrified (Evaluation A). From this result, it was found that the amount of Ba element is preferably $1.0 \times 10^{13}$ atoms/cm$^2$ or more.

Also, in Example 8-1 to Example 8-5 in which the inner wall of the quartz crucible was formed of a natural quartz layer, when the application amount of the gel-like liquid was changed for each Example and an amount of Ba element attached to the inner wall per 1 cm$^2$, in Example 8-1 in which the amount of Ba element was $5.0 \times 10^{14}$ atoms/cm$^2$, devitrification at the coated portion was 90% or more (Evaluation B). On the other hand, in Example 8-2 to Example 8-5, the amounts of the Ba element were $1.0 \times 10^{15}$ atoms/cm$^2$, $5.0 \times 10^{16}$ atoms/cm$^2$, $1.0 \times 10^{18}$ atoms/cm$^2$ and $5.0 \times 10^{18}$ atoms/cm$^2$ so that the entire surface of the applied portion was uniformly devitrified (Evaluation A). According to the above, it was found that the amount of the Ba element is preferably $1.0 \times 10^{15}$ atoms/cm$^2$ or more.

INDUSTRIAL APPLICABILITY

The method for pulling up silicon monocrystal of the present invention is suitably used for a recharge pull-up method (RCCZ method) for producing a plurality of silicon monocrystals from the same crucible.

The invention claimed is:

1. A method for pulling up and growing, by the Czochralski method, a silicon monocrystal from a melt obtained by fusing a silicon raw material for crystals within a quartz crucible, the method comprising:
   preparing a gel-like liquid having a viscosity of 10 to 500 mPa·s by mixing together:
      a devitrification accelerator comprising an alkaline earth metal or a compound containing an alkaline earth metal,
      a thickening agent, and
      a solvent, and
   applying the gel-like liquid to an inner surface of the crucible and drying the applied gel-like liquid prior to filling the quartz crucible with the silicon raw material for crystals,
   wherein:
      in the case where an inner wall of the quartz crucible is made of a synthetic quartz layer, the gel-like liquid is applied to a bottom surface of the quartz crucible inner wall or to both the bottom surface and a lateral surface of the inner wall, and the gel-like liquid is applied at a coating amount such that an amount of the alkaline earth metal or the compound containing the alkaline earth metal attached thereto is $1.0 \times 10^{13}$ to $1.0 \times 10^{16}$ atoms/cm$^2$ per 1 cm$^2$ of the inner wall, and
      in the case where the inner wall of the quartz crucible is made of a natural quartz layer, the gel-like liquid is applied to both the bottom surface and the lateral surface of the inner wall of the quartz crucible, and the gel-like liquid is applied at a coating amount such that an amount of the alkaline earth metal or the compound containing the alkaline earth metal attached thereto is $1.0 \times 10^{15}$ to $1.0 \times 10^{18}$ atoms/cm$^2$ per 1 cm$^2$ of the inner wall.

2. The method for pulling up silicon monocrystal according to claim 1, wherein the alkaline earth metal is magnesium, calcium, strontium or barium.

3. The method for pulling up silicon monocrystal according to claim 1, wherein the compound containing an alkaline earth metal is barium carbonate.

4. The method for pulling up silicon monocrystal according to claim 1, wherein a highly volatile solvent having a boiling point of less than 90° C. at normal pressure is contained as a solvent for the gel-like liquid.

5. The method for pulling up silicon monocrystal according to claim 1, wherein a plurality of silicon monocrystals are pulled up using the same quartz crucible.

6. The method for pulling up silicon monocrystal according to claim 1, wherein the gel-like liquid is applied with a brush made of chemical fiber or scraper at room temperature, or the gel-like liquid is applied by spraying at room temperature.

* * * * *